United States Patent [19]

Mosher

[11] Patent Number: 5,688,337
[45] Date of Patent: Nov. 18, 1997

[54] TEMPERATURE COMPENSATED PHOTOVOLTAIC ARRAY

[75] Inventor: Dan Michael Mosher, Plano, Tex.

[73] Assignee: Texas Instruments Incorporated, Dallas, Tex.

[21] Appl. No.: 565,428

[22] Filed: Nov. 30, 1995

[51] Int. Cl.$^6$ .................. H01L 31/042; H01L 31/05
[52] U.S. Cl. .................. 136/244; 136/293; 320/2; 320/35; 320/36
[58] Field of Search .................. 136/244, 291, 136/293; 320/2, 18, 30, 35–36; 323/906

[56] References Cited

U.S. PATENT DOCUMENTS

| | | | |
|---|---|---|---|
| 4,806,495 | 2/1989 | Levine et al. | 437/2 |
| 4,872,607 | 10/1989 | Jensen et al. | 228/180.1 |
| 4,917,752 | 4/1990 | Jensen et al. | 156/292 |
| 4,957,601 | 9/1990 | Levine et al. | 156/645.1 |
| 4,992,138 | 2/1991 | Jensen et al. | 156/644.1 |

FOREIGN PATENT DOCUMENTS

| | | | |
|---|---|---|---|
| 3525630 | 1/1987 | Germany | 320/35 |
| 5-83880 | 4/1993 | Japan | 136/293 |
| 5-122867 | 5/1993 | Japan | 136/293 |
| 6-46536 | 2/1994 | Japan | 320/35 |

*Primary Examiner*—Aaron Weisstuch
*Attorney, Agent, or Firm*—Robert C. Klinger; James C. Kesterson; Richard L. Donaldson

[57] ABSTRACT

A temperature compensated photovoltaic module (20) comprised of a series of solar cells (22) having a thermally activated switch (24) connected in parallel with several of the cells (22). The photovoltaic module (20) is adapted to charge conventional batteries having a temperature coefficient (TC) differing from the temperature coefficient (TC) of the module (20). The calibration temperatures of the switches (24) are chosen whereby the colder the ambient temperature for the module (20), the more switches that are on and form a closed circuit to short the associated solar cells (22). By shorting some of the solar cells (22) as the ambient temperature decreases, the battery being charged by the module (20) is not excessively overcharged at lower temperatures. PV module (20) is an integrated solution that is reliable and inexpensive.

3 Claims, 1 Drawing Sheet

TEMPERATURE COMPENSATED PHOTOVOLTAIC ARRAY

The government of the United States of America has rights in this invention pursuant to Subcontract No. ZAI-4-11294-04 awarded by the U.S. Department of Energy.

CROSS REFERENCE TO RELATED APPLICATIONS

Cross reference is made to commonly assigned co-pending patent application Attorney Docket No. TI-19328 entitled "Voltage Regulated Photovoltaic Module," filed herewith, the teachings incorporated herein by reference.

FIELD OF THE INVENTION

This invention is generally related to photovoltaic (PV) or solar cell arrays, and more particularly to a temperature compensated solar cell array that may be used for charging batteries in environments experiencing dramatic ambient temperature swings.

BACKGROUND OF THE INVENTION

Photovoltaic devices, commonly known as solar cells, are known in the art for converting the sun's solar energy into useful electrical energy. These solar cells may comprise a matrix or array of semiconductor spheres embedded in a light-reflective aluminum loft, the semiconductor material typically comprising silicon. Such solar cells arrays are disclosed in U.S. Pat. No. 4,806,495 entitled "Method of Making Solar Array with Aluminum Foil Matrix", U.S. Pat. No. 4,872,607 entitled "Method of Bonding Semiconductor Material to an Aluminum Foil", U.S. Pat. No. 4,917,752 entitled "Method of Forming Contacts on Semiconductor Members", U.S. Pat. No. 4,957,601 entitled "Method of Forming an Array of Apertures in an Aluminum Foil", and U.S. Pat. No. 4,992,138 entitled "Method and Apparatus for Constructing a Foil Matrix for a Solar Cell", each of these patents being assigned to the same assignee as the present invention, and the teachings incorporated herein by reference.

A common application of photovoltaic (PV) modules is to charge batteries so that the energy is available on demand. Charging is necessary for batteries used in remote locations, and usually in locations which experience dramatic ambient temperature swings. One problem in the art is that the temperature coefficient (TC) of the voltage output of a typical PV array, shown at 10, does not match the TC of the battery charging voltage, shown at 12, required to properly charge the battery, as illustrated in FIG. 1. The TC for charging a lead acid battery is about −5 mV/C.° per cell. The TC for a PV cell is about −2 mV/C.° per cell. It takes 6 PV cells in series to charge one battery cell when the PV cells are hot, with the total TC being −12 mV/C.° per battery cell charger. This −12 mV/C.° is more than twice the variation in the battery requirement. At a temperature of 0 degrees Celsius, the PV cell voltage will be 0.525 volts, or 18.9 volts for a 36 cell module meant for charging a 6 cell, 12 volt battery. The voltage required to properly charge the battery at 0 degrees Celsius is 14.6 volts. It can be seen in FIG. 1 that for a typical 36 cell module, the output voltage of the array can vary greatly over the expected operating temperature of the PV module. In that one use for PV modules is to charge batteries in remote locations that experience great temperature swings, such as in northern Canada, implementing a PV module well suited to charge a 14.6 volt battery in the summer can result in excessively overcharging the battery at low temperatures during the winter.

There is desired in the industry an integrated solution that is reliable, and inexpensive for efficiently charging batteries in remote locations that experience significant changes in ambient temperatures, such as those in northern Canada. A PV module that is well suited to charge conventional batteries over these extreme temperature swings is desired.

SUMMARY OF THE INVENTION

The present invention achieves technical advantages as a solar cell module with thermally activated switches connected across some of the individual PV cells in a solar cell module. Each switch has a different calibration temperature at which it changes from an open circuit (off state) to a closed circuit (on state). At high ambient temperatures, such as during summer, all switches are open and the PV modules produces a full voltage. As the ambient temperature of the module is lowered, such as during winter, the thermally activated switches turn on, whereby the switch with the highest temperature calibration would switch to an on state first, shorting out the associated PV cell and thus reducing the rise of the full module voltage. As the module temperature drops even more, additional switches turn on, shorting out the associated cells and further reducing the module voltage. According to the present invention, a PV module is realized having a voltage that more closely follows the battery charging requirements. By controlling the number of solar cells that contribute to the output voltage of the module as a function of ambient temperature, battery requirements can be met without excessively overcharging the battery at low temperatures. Each thermally activated switch is connected in parallel with one solar cell, and is preferably soldered in place on the solar cell array, thus providing an integrated solution that is reliable and inexpensive.

DETAILED DESCRIPTION OF THE PREFERRED EMBODIMENT

Figure 2:
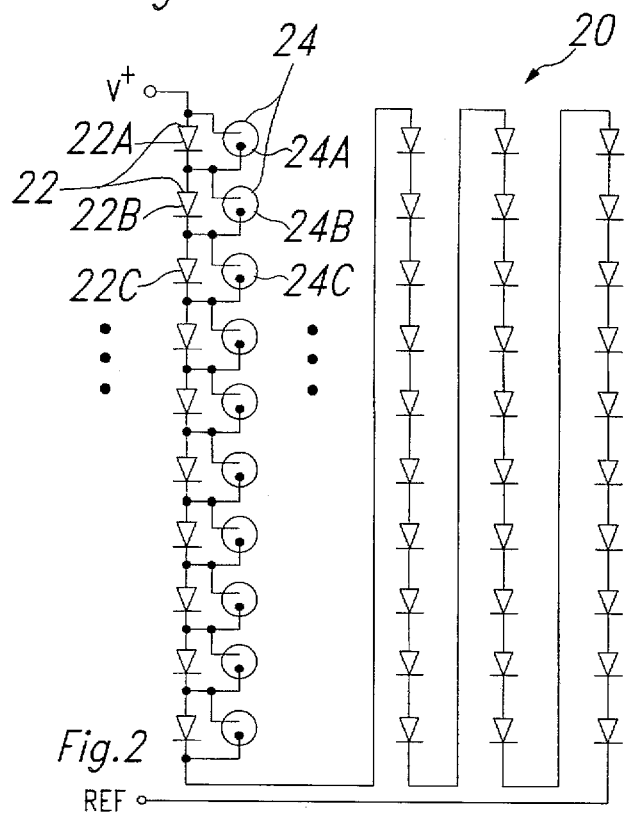
FIG. 2 is a schematic illustration of a temperature compensated PV module having several thermally activated switches, one switch being connected in parallel with several of the serially connected solar cells comprising the PV module.

Referring now to FIG. 2, there is generally shown at 20 a PV module or solar cell array according to the preferred embodiment of the present invention. Module 20 is seen to include several serially connected solar cells 22, illustrated as diodes, such as those which may be manufactured according to the teachings of the cross-referenced commonly assigned patents discussed in the section Background of the Invention. Again, these solar cells 22 may be comprised of a matrix of doped silicon spheres embedded in an aluminum foil matrix; however, other type of solar cells may be implemented as well, and limitation to solar cells such as those manufactured according to the teachings of the cross-referenced patents is not to be inferred.

According to the preferred embodiment of the present invention, several thermally activated switches 24 are utilized, one being connected in parallel with each of several of the solar cells 22. As illustrated in FIG. 2, but without limitation thereto, a thermally activated switch 24 is connected in parallel with each of the first ten (10) solar cells 22 of a forty (40) cell array. Switches 24 are thermally activated switches each having a different calibration temperature whereby each switch changes from a closed circuit (on state) to a open circuit (off state) at different elevated temperatures. In other words, at colder temperatures, the switches turn on and are closed circuits. Each switch 24 has a different calibration temperature, these temperatures being selected at intervals, whereby the colder the temperature, the more switches that are a closed circuit or in the on state to short the associated solar cells 22.

Figure 1:
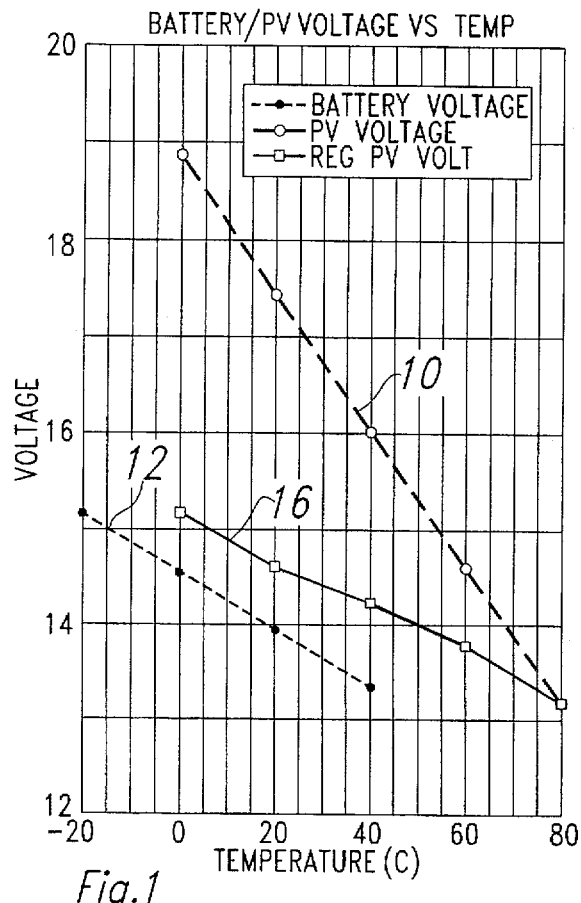
FIG. 1 is a plot of a preferred battery voltage as a function of temperature, a plot of the output voltage of a typical PV cell without temperature compensation as a function of temperature, and a plot of the regulated PV voltage as a function of temperature according to the preferred embodiment of the present invention.

For instance, at 80° Celsius, all switches 24 are in the off state, and thus are an open circuit and all cells 22 contribute to the module voltage output across terminals V+ and Ref. At 72° Celsius, switch 24A is in the on state, thus shorting out solar cell 22A. At 64° Celsius, the calibration temperature of switch 24B is such that it switches to an on state, thus shorting out associated solar cell 22B. Next, at an ambient temperature 56° Celsius, the calibration temperature of switch 22C is such that it switches to an on state, thus shorting out associated solar cell 22C, and so on. At 0° Celsius, all switches 24 would be switched to an on state thus shorting out the associated solar cells 22 that they are in parallel with. This leaves only the solar cells 22 without an associated thermally activated switch enabled to generate a voltage from the incident solar energy. However, at 0° Celsius, the output of these active solar cells 22 produces a sufficient voltage between terminals V+ and Ref of approximately 15.2 volts to charge an associated battery. The voltage output of module 20 is shown in FIG. 1 at 16, and can be seen to closely followed the preferred charging voltage of the battery across the operative temperature range.

By providing thermally activated switches 24 having different calibration temperatures, which may be different by uniform increments, the colder the ambient temperature for module 20, the more solar cells 22 that are shorted and thus do not contribute to the output voltage of the module 20. A charging voltage can be provided across terminals V+ and Ref whereby a slightly higher voltage is provided at 0° Celsius than at 80° Celsius, with the output voltage following the desired charging voltage of the battery between the temperatures of 0° Celsius and 80° Celsius, as shown at 16 in FIG. 1.

Still referring to FIG. 2, the switches 24 are chosen to have calibration temperatures which differ by 8° Celsius from one to the next so that for each change in ambient temperature of 8° Celsius, another switch 24 will turn on or off depending on if the ambient temperature is increasing or decreasing respectively. However, it is to be understood that the differences in calibration temperatures can be more or less than a difference of 8° Celsius, that the increments may not be uniform, and that more or less than the ten switches 24 can be used. The present invention is directed to a solar cell module with one thermally activated switch connected in parallel with several of the serially connected solar cells so that the temperature coefficient of the PV module is more closely related to the temperature coefficient of the battery so that excessive overcharging of the battery is not encountered at low temperatures.

In the present invention, switches 24 are preferably bi-metallic snap switches, such as Clixon® thermally activated switches manufactured by Texas Instruments Incorporated. However, other thermally activated switches may be implemented in the present invention as well.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

I claim:

1. A solar cell module, comprising:

a plurality of solar cells interconnected in series; and a plurality of thermally activated switches connected in parallel with at least some said solar cells, wherein said switches are activated at different temperatures, whereby said solar cells in parallel with said associated switches are shorted at different temperatures.

2. The module as specified in claim 1 whereby at least approximately 25% of said solar cells have one said switch in parallel therewith.

3. The module as specified in claim 1 whereby said switches are of the type which turn on when a sufficiently cold temperature is reached, whereby the colder the ambient temperature the more said switches that are turned on to short the associated solar cells.

* * * * *